(12) United States Patent
Kopp (10) Patent No.: US 8,443,019 B2
(45) Date of Patent: May 14, 2013

(54) METHOD AND APPARATUS HAVING A MEASURED VALUE INPUT FOR APPLYING A MEASURED VALUE

(75) Inventor: Manfred Kopp, Wolfach (DE)

(73) Assignee: Vega Grieshaber KG, Wolfach (DE)

( * ) Notice: Subject to any disclaimer, the term of this patent is extended or adjusted under 35 U.S.C. 154(b) by 909 days.

(21) Appl. No.: 12/561,795

(22) Filed: Sep. 17, 2009

(65) Prior Publication Data

US 2010/0169398 A1     Jul. 1, 2010

Related U.S. Application Data

(60) Provisional application No. 61/121,413, filed on Dec. 10, 2008.

(30) Foreign Application Priority Data

Nov. 19, 2008  (EP) .................................... 08020118

(51) Int. Cl.
  *G06F 7/00*   (2006.01)
  *G06F 15/00*  (2006.01)
(52) U.S. Cl.
  USPC ............................. 708/205; 708/207; 708/209
(58) Field of Classification Search .................. None
  See application file for complete search history.

(56) References Cited

U.S. PATENT DOCUMENTS 6,233,595 B1    5/2001  Cheng et al.
2006/0066731 A1*  3/2006  Zhou ........................... 348/222.1

FOREIGN PATENT DOCUMENTS

| DE | 10 2006 013 827 | 9/2007 |
| EP | 0 278 529 | 2/1988 |
| JP | 61049234 | 3/1986 |

OTHER PUBLICATIONS

"Application Insight Through Performance Modeling" by Marin and Mellor-Crummey, pp. 65-74, publication date: 2007.
"Computer Arithmetic: Algorithms and Hardware Designs" by Behrooz Parhami, publication date: 2000; pp. 143-153, 200-203, p. 147; figures 9.4, 9.6.
16-Bit Floating-Point Math in an 8-Bit Microprocessor, vol. 32, No. 7, Dec. 1989, IBM Technical Disclosure Bulletin, 2 pages.
EPO Search Report, EP Pat. Appln. No. 08 020118.9, dated Feb. 22, 2012, 7 pages—English, 7 pages—German.

* cited by examiner

*Primary Examiner* — Scott Sun
(74) *Attorney, Agent, or Firm* — Andrew F. Young, Esq.; Lackenbach Siegel, LLP (57) ABSTRACT

The invention pertains to a device such as a sensor, operator device, communication device, or a liquid level metering device, with a measured value input to apply a measured value. The device includes at least a first memory region to provide for an adjustment factor, and a computer, which is designed and/or controlled to multiply a first whole number by a floating-point number to obtain a product of the multiplication, while the first whole number corresponds either to the applied measured value or the provided adjustment factor; and, the floating-point number corresponds to the other measured value or to the adjustment factor. The computer has a second memory region for the storing of the floating-point number in a format of a second whole number, and the computer is designed and/or controlled to carry out a multiplication of the first whole number and the second whole number.

22 Claims, 7 Drawing Sheets

| V | E | E | E | E | E | E | E | E | M | M | M | M | M | M | M | M | M | M | M | M | M | M | M | M | M | M | M | M | M | M | M |

Exponent

Mantisse

Vorzeichen

Transalation Key
Key : Mantisse = mantissa
Vorzeichen = sign

METHOD AND APPARATUS HAVING A MEASURED VALUE INPUT FOR APPLYING A MEASURED VALUE

CROSS REFERENCE TO RELATED APPLICATIONS

This application is related to, and claims priority from, U.S. Provisional Patent Application Ser. No. 61/121,413, filed Dec. 10, 2008, and European Patent Application EP 08 020118.9 filed Nov. 18, 2008, the entire contents of each of which are incorporated herein by reference.

FIGURE SELECTED FOR PUBLICATION

FIG. 3

BACKGROUND OF THE INVENTION

1. Field of the Invention

The present invention relates to a method for detection and compensation of a rapid temperature change at a pressure metering cell. More particularly, the present invention relates to at least one of a sensor, an operating device, a communication device, or liquid level metering device with a computer, and adaptively or in combination with a method for actuating a computer of such a sensor, operating device, communication device, liquid level metering device.

2. Description of the Related Art

Liquid level metering devices detect measured values related to a level of filling in a receptacle. Besides a sensor for detecting the measured values, such liquid level metering devices also often have computers. These serve to multiply a measured value detected by a sensor by an adjustment factor in order to balance out sensor influence or device influence when detecting the measured value. Often the actual measured value is created as a whole number by an analog-digital converter, while the adjustment factor is a real number in the form of a floating-point number. Accordingly, the computer must multiply a whole number by a floating-point number to obtain a product.

On a computer, especially a microcomputer with a very small memory of such a conventional liquid level metering device, one often has to multiply a whole number, which can be represented e.g. as data type short int, int, or (long) int in C or as data type INTEGER or LONGINT in Pascal, by a floating-point number, such as 1.2288, which can be represented e.g. as data type float in C or as data type REAL in Pascal, and once again the outcome should be a whole number. This operation is required, e.g., when a measured raw value has to be multiplied by a factor to obtain a precise measured value. In this case, one will use arithmetic operations for floating-point numbers instead of multiplications and divisions for whole numbers; since the microcomputer does not have these arithmetic operations built into its command set, it therefore needs to call them up as library functions. These library functions require a lot of commands from the command set of the microcomputer and therefore first of all, they consume a lot of memory, which is often not available on the microcomputer, and secondly a lot of computing time, which means an increased power demand, since the microcomputer cannot use any power saving mode during this time. Furthermore, it might mean that the particular technical problem can only be solved if the computing time is very small and the maximum speed of the microcomputer, especially its clock frequency, cannot be increased for technical reasons. Permissible limit values of the components of the microcomputer and power demand depending on clock frequency therefore limit the use of microcomputers in sensors and liquid level meters.

At present, a whole number is multiplied by a floating-point number in 2 ways. According to the first way, the whole number is multiplied by a second whole number and then the product is divided by a third whole number, while the quotient of the second and the third whole number must correspond as accurately as possible to the real number. According to the second way, the whole number is transformed into a floating-point number, e.g., 89 is changed to 89.0, and an arithmetic operation is used for the multiplication of the two floating-point numbers. After this, the result is changed back into a whole number.

A special encoding procedure is currently used for floating-point numbers in microcomputers in order to do arithmetic with floating-point numbers. The basis of the procedure is the fact that a floating-point number x can also be approximated by a mathematical series. This method is used, e.g., for the representation of floating-point numbers in the IEEE-754 floating-point format. Since microcomputers can work very well with numbers in the dual number system, the series of negative powers of two is used. Any given (real) number x can then be represented approximately as $$x \approx (-1)^s \cdot 2^e (m_0 + m_1 2^{-1} + m_2 2^{-2} + m_3 2^{-3} + \ldots + m_p 2^{-p}) = s \cdot 2^e \sum_{0}^{p} m_n 2^{-n},$$

where the coefficients of the mantissa m0 . . . mp can be 0 or 1 and the sign s=0 for a positive and s=1 for a negative number. The exponent in this binary exponential notation is e, which does not signify Euler's number.

Figure 6:
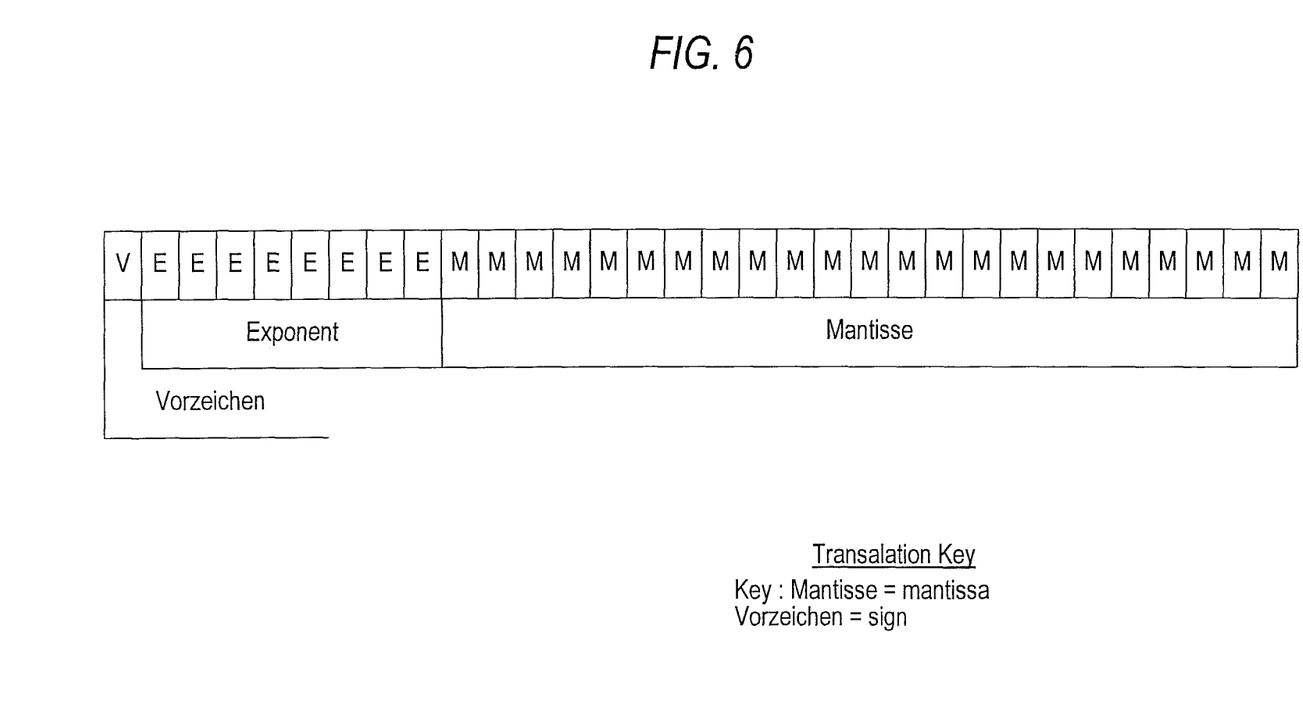
FIG. 6 provides a conventional encoding of a floating-point number in the IEEE-754 32-bit floating-point format.

Referring now to FIG. 6, this figure shows the core image format of a floating-point number in the IEEE-754 32 bit floating-point format, as it is customarily encoded for storage between several processing steps within microcomputers and transfer between microcomputers and data media or between several microcomputers.

In the microcomputer, a number in the IEEE-754 floating-point format with 32 bits is stored with one bit for the sign S, 8 bits of the exponent E and 23 bits of the mantissa M. The most significant bit (MSB) of the mantissa M and the exponent E are at the far left, the least significant bit (LSB) at the far right. There are other versions of IEEE-754 formats for greater or lesser accuracy. Furthermore, there are forms of representation of binary encoded numbers in which the MSB is at far right. If a microcomputer uses such a form of representation also internally for its register and arithmetic logic unit (ALU), the directions for shift operations in multiplying or dividing by 2 will also be reversed accordingly. In any case, the form of representation with MSB at far left is usually adopted, even when the microcomputer processes numbers made up of several bytes in the little endian format, which means that the significance of the individual bytes (groups of 8 bits) increases according to the storage address. In terms of position of the storage addresses in microcomputers with little endian format, the least significant byte therefore stands at far left if one takes storage addresses as increasing from left to right. On the contrary, in microcomputers with big endian format, the least significant byte stands at far right and the significance decreases in accordance with the storage address. However, this difference only has consequences when the microcomputer requires several operations and storage accesses to process data words of greater width than the word width of its register and the data storage.

The mantissa of every number different from 0 in this representation can be altered by multiplying with 2, which corresponds to a left shifting of the mantissa by one bit, and simultaneously reducing the exponent by 1 per each shift for as long as the coefficient is m0=0 and until it first becomes 1, without anything changing in the value of the number. If the number of shifts in this process is n, the exponent will be reduced by n and the factor 2e in front of the mantissa will be divided by 2n and at the same time the mantissa will be multiplied by 2n. This option is always used in the IEEE-754 floating-point format. A floating-point number in such a form is then said to be "normalized".

Since, for a "normalized floating-point number", the first coefficient or the highest bit, also known as the MSB, of the mantissa is always 1, one does not need to save this 1 in memory and thereby gains 1 additional bit for the resolution or precision p.

The highest bit of the mantissa, not memorized in the IEEE-754 floating-point format, is therefore also known as a hidden bit.

However, there are also other formats for floating-point numbers in which the highest bit of the mantissa is also saved in memory. Especially in computations with floating-point numbers, the highest bit having the value 1 must be put back in order to get a correct calculation result.

Another peculiarity results in that the exponent e is saved with a shifting (or bias B), so that e=E−B or E=e+B, with E being the memorized exponent. The bias used here is $2^{r-1}-1$, if r is the resolution or the bit number of the exponent. Thus, B=127 when r=8.

The mantissa m of a "normalized" floating-point number always lies precisely in the interval $1.0 \leq m < 2.0$. This applies for the notation as a binary number, number base 2. Formulated generally, the mantissa m of a "normalized" floating-point number always lies precisely in the interval $1.0 \leq m < N$, if N is the number base used for the notation. Therefore, for the representation of the number 0 in the IEEE-754 floating-point format, a special notation is required. Accordingly, a number is precisely 0 when mantissa m and exponent e are 0 at the same time.

Hence, the exponent E of the number 1.0 is saved as 127 per $2^{127-127} \times 1.00 \ldots = 2^0 \times 1.00 \ldots$ and the exponent of the number 0.0 as 0 per $2^{0-127} \times 1.00 \ldots = 2^{-127} \times 1.00 \ldots$. The 1.00 . . . in the mantissa come from the always implicitly assumed 1 in the unsaved bit m0 of the mantissa for a normalized number. In any case, $2^{-127}$ is practically equal to 0 in calculations and moreover a special treatment can be done for the case when E=0 and M=1.0, i.e., all saved bits of M are 0.

The drawback in such solutions of the prior art in the case of whole numbers is that the arithmetic operation for whole number division is required. This operation requires a lot of program and data memory and computing time, if the microcomputer does not have this arithmetic operation built into its command set. The product of the whole number and the second whole number may then leave the range of whole numbers, such as 16 bit, and require whole number operations with an increased range of numbers, such as 32 bits.

The drawback with floating-point numbers is that the arithmetic operation for the multiplication of two floating-point numbers is required. Furthermore, conversion programs of whole number to floating-point number and floating-point number to whole number have to be carried out. All three operations require a lot of program and data memory and computing time, if the microcomputer does not have this arithmetic operation built into its command set. Moreover, the power consumption of the computation is high.

ASPECTS AND SUMMARY OF THE INVENTION

One aspect or problem of the present invention now recognized by the inventor is to provide a sensor or an operator device or a communication device or a liquid level metering device with a computer and a method for actuating such a computer for the multiplication of a whole number by a floating-point number, which makes do with low memory demand, short computing time, and thus low power demand. In particular, no arithmetic operations for floating-point number and no division for whole numbers should be used.

This aspect or problem is solved by a sensor or an operator device or a communication device or a liquid level metering device with a computer as discussed herein below and by a method for actuating a computer of a sensor or an operator device or a communication device or a liquid level metering device for the multiplication of a whole number by a real number, especially a floating-point number. Advantageous embodiments are the subject of related claims.

Thus, one starts from a sensor or an operator device or a communication device or a liquid level metering device with a measured value input to apply a measured value, at least a first memory region to provide for an adjustment factor, and a computer, which is designed and/or controlled to multiply a first whole number by a floating-point number to obtain a product of the multiplication, while the first whole number corresponds either to the applied measured value or another measured value, on the one hand, or to the provided adjustment factor, on the other hand, and the floating-point number corresponds to the adjustment factor. Usually, the whole number corresponds to the measured value and the floating-point number to the adjustment factor. Advantageously, the sensor, the operator device, the communication device or the liquid level metering device is characterized in that the sensor has a second memory region for the storing of the floating-point number in a format of a second whole number, especially with corresponding exponent and sign, and the computer is designed and/or controlled to carry out a multiplication of the first whole number and the second whole number.

In particular, the computer has a logic which is designed and/or controlled to convert the floating-point number into an exponential number, especially a binary one with one place for the sign and a plurality of places for an exponent and a plurality of places for a mantissa as the second whole number and to discard a number of places of the multiplication product after the multiplication depending on a precision of the mantissa and of the exponent.

The first memory region and a logic of the computer actuating the second memory region are preferably designed to save the second whole number as a binary number with a plurality of places for an exponent and a plurality of places for a mantissa.

One region of the computation memory is preferably designed or can be actuated as a register and the computer preferably has a logic which is designed and/or controlled to perform the multiplication by a power of two and/or a division by a power of two through a bitwise shifting of a content of the computation memory region.

Such an arrangement makes it possible to multiply or divide two whole numbers, of which the second whole number represents an exponential, or especially a binary representation of the mantissa of a floating-point number, by simple shift operations and additions. No mathematically complicated multiplication or division algorithms are required for this. Finally, such a floating-point number and a whole number can be multiplied by using only additions and shift operations to put out a whole number as the product of the multiplication.

Preferable in itself is a method for actuating a computer of a sensor or operator device or communication device or liquid level metering device to multiply a whole number by a floating-point number to obtain a product of the multiplication, wherein the first number corresponds either to the applied or to another measured value or to a provided adjustment factor and the second number as a floating-point number corresponds to the other measured value or to the provided adjustment factor and wherein the floating-point number is provided in a representation of a second whole number and a multiplication of the first whole number and the second whole number is performed.

As the second whole number, the floating-point number is preferably converted into an exponential, especially a binary number with one place for a sign and a plurality of places for an exponent and a plurality of places for a mantissa. In particular, a number of places of the multiplication product depending on a precision of the mantissa and of the exponent is discarded after the multiplication.

To perform the multiplication, an adding and a bitwise shifting of a content of a computation memory region or a corresponding reading out of the content of the computation memory region is preferably done repeatedly.

For the multiplication, a whole number multiplication command of a computer can be carried out, wherein a mantissa of the floating-point number, especially the mantissa of a floating-point number in the IEE-754 floating-point format, is interpreted as a whole number and multiplied by the first whole number, whereupon p-e bits are discarded after the multiplication, corresponding to an exponent with e bits and a precision p of the mantissa.

A loop of additions and shift operations is preferably terminated prematurely after a number of K iterations of the loop, once all further coefficients of the mantissa are equal to 0, whereupon K-e bits are discarded after the multiplication, corresponding to an exponent e and a precision p of the mantissa, and the number K of loop iterations is at most as large as the precision p. This premature ending of the sequence or program loop makes sense, since only the value 0 would still be added to the sum.

To perform a division by a power of two, a bitwise shifting of a content of a computation memory region or a corresponding reading out of the content of the computation memory region can be carried out.

The second whole number, especially as a floating-point number in the IEEE-754 floating-point format, can optionally be calculated externally with the corresponding exponent and the corresponding sign and provided in a second memory region of the liquid level metering device's computer. This enables an external calculation, especially when the floating-point number is constant for various measured values within a measurement device or a series of measurements, so that no conversion is needed within the computer of the liquid level metering device and it can be outfitted more easily.

The multiplication can be performed by multiplying the value of a sum by the value of the base of the exponent repeatedly in a loop and if a corresponding bit of the mantissa of the second whole number is not equal to zero, the value of the first whole number is added to the sum, and the significance of the bit of the second whole number (xm), which is checked in each loop, becomes smaller from one loop to another. Finally, and preferably, the product of the multiplication is taken to be the value of the sum divided by the power of two of the number of loop iterations and it is finally increased by the value of the rounding bit, especially with the value 0 or 1. In particular, the product of the multiplication is finally taken to be the value of the sum from which bits were previously discarded by a division by a power of two and to which the value of a rounding bit was finally added, corresponding to the most significant one of the bits previously discarded by the division by the power of two.

Thus, on a computer, especially on a microcomputer with a very small memory, one can multiply a whole number, e.g., 89, by a floating-point number, e.g., 1.2288, and the result will again be a whole number, e.g., 109. This operation is advantageous, e.g., when one needs to multiply a measured raw value by a factor in a liquid level metering device to get a precise measured value. No arithmetic operations for floating-point numbers and no multiplication or division for whole numbers need to be used in this process, so that the microcomputer does not need to have these arithmetic operations built into the command set, nor does it need to call them up as library functions. Therefore, no library functions are needed, which require a lot of commands from the command set of the microcomputer and therefore use up a lot of memory, which is not available on the microcomputer, and also a lot of computing time, which means higher power consumption. Therefore, the microcomputer can also use an energy saving mode during this time.

Furthermore, the computing time remains very low and the maximum speed of the microcomputer or the clock frequency does not have to be increased for technical reasons. Thus, one can use microcomputer components with low requirements on their limit values and the energy consumption is directly dependent on a clock frequency which is quite low. One should stress the very low program memory demand, very low computing time, and thus optionally a very low power demand.

The present invention relates to a device such as a sensor, operator device, communication device, or a liquid level metering device, with a measured value input to apply a measured value. The device includes at least a first memory region (40) to provide for an adjustment factor, and a computer (2), which is designed and/or controlled to multiply a first whole number (z) by a floating-point number (x) to obtain a product (g) of the multiplication, while the first whole number (z) corresponds either to the applied measured value or the provided adjustment factor and the floating-point number (x) corresponds to the other measured value or to the adjustment factor, and the computer has a second memory region (41m, 41e, 41s) for the storing of the floating-point number (x) in a format of a second whole number (xm), and the computer is designed and/or controlled to carry out a multiplication of the first whole number (z) and the second whole number (xm). The invention further pertains to a method for the actuating of such a device or computer as described wherein multiplication can be done by mere additions and shifts of a saved computation quantity.

The above, and other aspects, features and advantages of the present invention will become apparent from the following description read in conduction with the accompanying drawings, in which like reference numerals designate the same elements.

DETAILED DESCRIPTION OF THE PREFERRED EMBODIMENTS

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but also include connections through mediate elements or devices.

Figure 1:
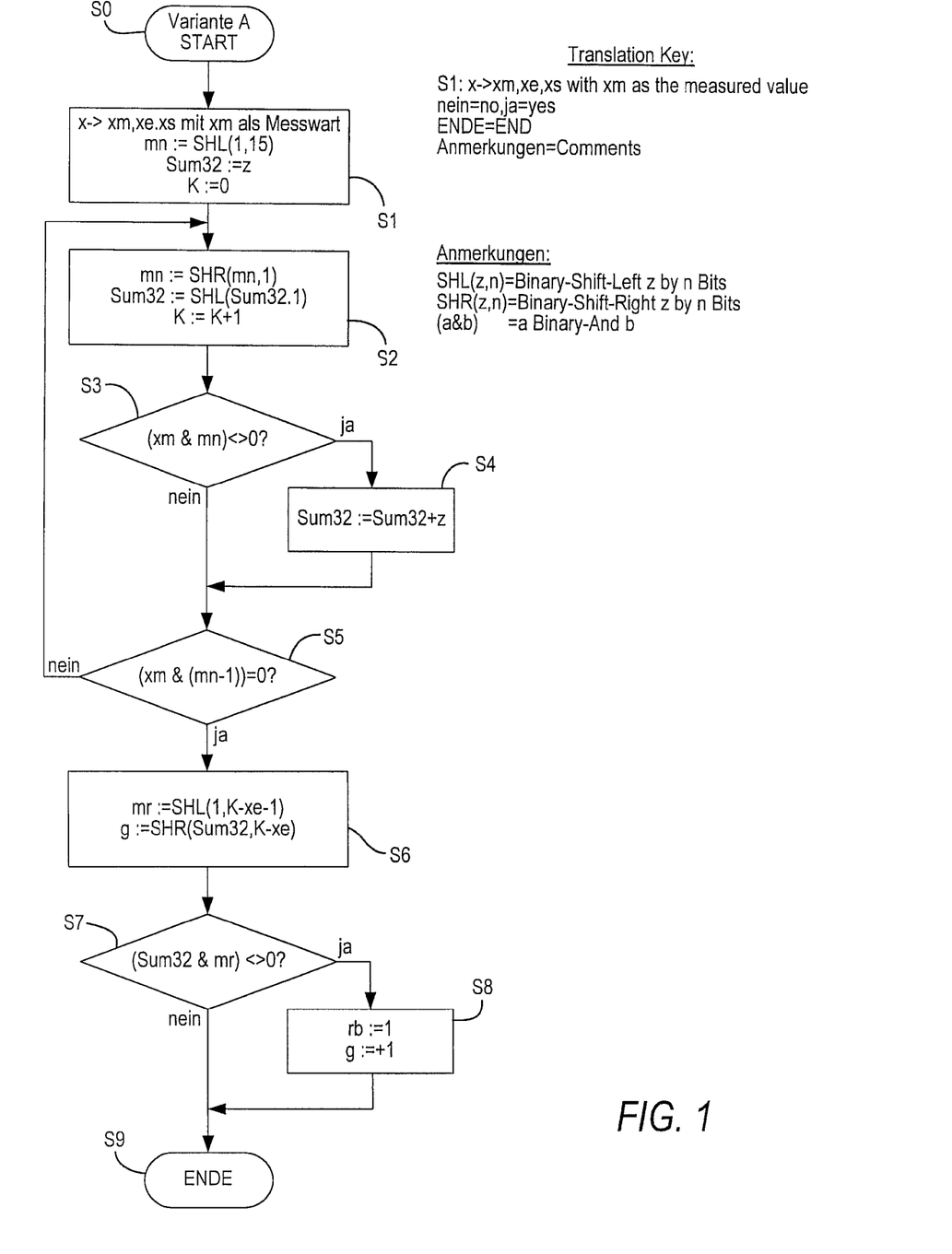
FIG. 1 depicts a flow chart of a first preferred way of carrying out a multiplication of a whole number by a floating-point number in a liquid level metering device.

FIG. 1 shows an algorithm which works in a microcomputer (hereinafter also referred to as a data processing system) with a 32-bit sum Sum32 and which calculates all members of the sum Sum32 in order to multiply a first whole number z and a floating-point number x, transformed into a binary second whole number xm and an exponent xe and a sign xs, and obtain a whole number product g at the output.

After a start S0 of the algorithm, variables and memory regions are pre-allocated in a first step S1. One loads a value xm and accordingly an exponent xe and a sign xs, corresponding to the floating-point number x. The loading occurs in the form of the binary second whole number xm along with the exponent xe, likewise in the form of a binary whole number and the sign xs in the form of a truth value. For this, either the transformation of the floating-point number x into the binary second whole number xm with corresponding exponent xe and sign xs is performed in the microcomputer itself or the corresponding second whole number xm with corresponding exponent xe and sign xs is supplied from an external computer and entered into an appropriate memory region. Furthermore, another memory region is loaded with the value of the first whole number z, and in this memory region as well the whole number z is stored as a binary number. Moreover, a mantissa mask mn is preallocated in a memory with the bit value of the most significant bit corresponding to the second whole number xm. For the following steps of the computation, furthermore, a sum Sum32 is loaded with the value of the first whole number z and a variable for a number K of loop iterations with the value "0".

After this, a calculation loop is initiated, in which in a second step S2 of the method the bits of the mantissa mask mn are right shifted by one bit, which is indicated in the figures as the operation SHR, in order to provide the bit value of the mantissa xm to be checked for further steps. Moreover, the bits in the memory region for the sum Sum32 are left shifted by one bit, which is characterized in the figures as the operation SHL. The variable for the number K of loop iterations is incremented by the value "1".

In a following third step S3 of the method, a check is made as to whether the value of the mantissa xm with its currently valid bit is not equal to zero. This can occur by checking the outcome of a bitwise AND operation or & operation between the mantissa xm and the mantissa mask mn. If yes, in a fourth step S4 of the method, the value of the sum Sum32 is incremented by the value of the first whole number or the first whole number is added. In a following fifth step S5, a polling is done to see if all subsequent bits of the mantissa xm or coefficients are equal to zero. If it is found in the third step S3 of the method that the bit of the mantissa xm being checked is equal to zero, one goes directly to the fifth step of the method.

If, in the fifth step S5 of the method, it is determined that still more bits of the mantissa xm are not equal to zero, one returns to the second step of the method. In other words, the loop thus formed is run through as often as it takes to determine that all further addition steps would merely result in an adding of a value of zero. Furthermore, the loop preferably ends not later than after K=p−1 iterations, if the mantissa xm is saved with p bits precision, for then by multiple right shift operations of the bits of the mantissa mask mn the latter will have a value of 1 and therefore (mn−1) would be equal to zero and thus at the same time the result of the binary AND operation of xm and (mn−1) would be equal to zero.

If the loop is finished in the fifth step S5 of the method, one moves on to a sixth step S6. In this step, a bit mask mr for the rounding bit rb is loaded with the value which results by performing a left shift SHL of the number 1 by the number K of loop iterations minus 1. The bit set ON in the bit mask mr then corresponds to the most significant bit, which is discarded in a right shift of the sum Sum32 by the number K of loop iterations. Furthermore, a right shift SHR is done as a logical shifting of the bits in the memory region for the sum Sum32 by the number K of loop iterations and the resulting value is set as the tentative result g.

In a following seventh step S7, a check is made as to whether the result of a binary AND operation of the sum Sum32 with the bit mask mr is not equal to zero. If the bit of the sum Sum32 corresponding to the bit mask mr is set ON, a rounding off must be done. In this case, in an eighth step S8 of the method, the round bit rb=1 and therefore the value of the result g is incremented by "1". After this, the algorithm ends with S9, which otherwise happens directly if the polling in the seventh step S7 of the method determines that the result of the AND operation is equal to zero.

Mathematically, the procedure can be described by the following relations. When a whole number z is being multiplied by a floating-point number x and one is supposed to get the whole number g as the product or result g, one can write the following approximation formula, according to an approximation equation for floating-point numbers, such as is used for the IEEE-754 floating-point format:

$$g = z \cdot x \approx z \cdot (-1)^s \cdot 2^e (m_0 + m_1 2^{-1} + m_2 2^{-2} + m_3 2^{-3} + \ldots + m_p 2^{-p})$$

$$= (-1)^s \cdot 2^e \sum_0^p m_n 2^{-n}$$

This approximation formula can be transformed into $$g = z \cdot x \approx (-1)^S \cdot 2^e \begin{pmatrix} z \cdot m_0 + z \cdot m_1 2^{-1} + z \cdot m_2 2^{-2} + \\ z \cdot m_3 2^{-3} + \ldots + z \cdot m_p 2^{-p} \end{pmatrix}$$

$$= (-1)^S \cdot 2^e \sum_0^p z \cdot m_n 2^{-n}$$

In a further step, the series can be simplified by multiplying each member of the sum by $2^p$ and then dividing the sum by $2^p$ to yield:

$$g = z \cdot x \approx \frac{\begin{pmatrix} (-1)^S \cdot 2^e \cdot z \cdot m_0 2^p + z \cdot m_1 2^{p-1} + \\ z \cdot m_2 2^{p-2} + z \cdot m_3 2^{p-3} + z \cdot m_p 2^{p-p} \end{pmatrix}}{2^p}$$

or, since $2^{p-p}=2^0=1$, even more simple:

$$g = z \cdot x \approx$$
$$(-1)^S \cdot \frac{2^e}{2^p} \cdot (z \cdot m_0 2^p + z \cdot m_1 2^{p-1} + z \cdot m_2 2^{p-2} + z \cdot m_3 2^3 + \ldots + z \cdot m_p)$$

this not being given in the sum formula notation.

Now, the elements found in the series only contain values which can have the value 0 or $z \cdot 2^n$ ($n >= 0$), since the coefficients of the mantissa $m_0 \ldots m_p$ can only be 0 or 1. This means that one gets a sum of members $z \times 2^n$. It is advantage to utilize the fact that the arithmetic operation $z \times 2^n$ for any given whole number z in the binary representation, which is normally used in microcomputers, can be achieved by n-fold multiplication by 2, and the n-fold multiplication by 2 corresponds to a left shift by n bits.

Since the sum series is a polynomial of base 2, one can use the Horner scheme corresponding to the following general example for a polynomial:

$$y = a_n x^n + a_{n-1} x^{n-1} + a_1 x^1 + a_0 = ((\ldots((a_n \cdot x + a_{n-1}) \cdot x + a_{n-2}) \cdot x + \ldots) \cdot x + a_1) \cdot x + a_0$$

In this way, one gets an even more simple approximation formula, one which is optimized for arithmetic processes, in the form $$g = z \cdot x \approx (-1)^S \cdot \frac{2^e}{2^p} \cdot$$
$$(((\ldots((z \cdot m_0 \cdot 2 + z \cdot m_1) \cdot 2 + z \cdot m_2) \cdot 2 + \ldots) \cdot 2 + z \cdot m_{p-1}) \cdot 2 + z \cdot m_p)$$

In this notation for the sum, one notices that only the value of z needs to be added for each bracket level if the coefficient of the mantissa is $m_n=1$ and then the new sum has to be multiplied by 2, the multiplication corresponding to a simple left shift by 1 bit.

This simplifies the entire calculation to two simple operations, which any microcomputer can perform directly with a single machine command and which are repeated p times in a program loop. It should be noted that the formation of a sum should be done with increased number of bits, i.e., data word length, or else a whole number overflow would occur. This means that the data word length is $d=w+p$, if w is the data word length of z.

After formation of the sum Sum32, all that remains is to divide this sum Sum32 by $2^{p-e}$, which corresponds to a right shift by p-e bits.

If the sign bit of x was set ON, i.e., S=1, the resulting value will also be negated. When using the twos complement representation for whole numbers, the sign of z is already taken into account in the sum, i.e., when z<0, then a negative sum results. When using signed numbers for z, it is preferable to make sure that, during the addition at the sum storage, if the latter has a larger word width than z, i.e., 32 instead of 16 bits, a correct sign expansion of z to the upper bits is done and furthermore that shift operations are used for the multiplication or division by 2 that preserve the sign bit, which can be implemented by a so-called arithmetic shift. For technical applications, it is often enough to use signed numbers for z, so that the sign bit, not present for z, does not need to be taken into account and can be ignored for x. Alternatively, the sign can also be saved in its own storage in order to carry out the processing without signs and then add back the sign.

The result is the product $g = z \times x$ as a whole number, while the p-e bits that are lost and that formerly stood at far right are binary places after the decimal point and can continue to be used if so desired.

If the whole number z is positive and the factor x lies in the interval $1 <= z < 2$, i.e., the sign is s=0 and the exponent is e=0 and thus $2^e=1$, one achieves a further simplification, since the sum now only needs to be divided by $2^p$ at the end. This corresponds to a right shift by p bits. In this case, there is no need to work with the sign.

In technical application, a word width of 16 bits for the whole number z is usually adequate. Furthermore, it usually makes little sense to save the mantissa M of the factor x with precision higher than the whole number z. Thus, one can work with 16 bits for the whole number z and for the mantissa M of the factor x. That is, the precision p or accuracy is p=15 and the sum Sum32 will be obtained, being at most 32 bits in size. If the mantissa of the factor x has a higher precision p1 than the p being used, p bits will be removed from the mantissa from the most significant bit or MSB working downwards and the following bits will be discarded. If the highest of the discarded bits was 1, rounding off has to be done by incrementing the mantissa used with 1, if the required accuracy so demands.

With such a procedure, a whole number, such as 89, can be multiplied by a floating-point number, such as 1.2288. For this, the whole number of value g=109 must be obtained as the result g.

According to the second step S2, the numbers z and x being multiplied are made ready in corresponding registers or memory regions 40, 41 in binary representation with word width of 16 bits, for example.

The representation of the numbers z and x being multiplied thus corresponds to the following table:

| Number | Hexadecimal code | Binary code |
|---|---|---|
| z = 89 | $0059_{16}$ | $0000\ 0000\ 0101\ 1001_2$ |
| x = 1.2288 | $9d49_{16}$ (mantissa) | $1001\ 1101\ 0100\ 1001_2$ | with $1.2288 = 2^0 + 2^{-3} + 2^{-4} + 2^{-5} + 2^{-7} + 2^{-9} + 2^{-12} + 2^{-15} = 1.22879028$. The notation $100_2$ in binary code signifies 100 to base 2=4 decimal and the notation $0100_{16}$ in hexadecimal code accordingly signifies 100 to base 16=256 decimal.

Performing the multiplication according to the above derived optimized approximation formula g=z×x, yields:

$$g \approx 2^{-15} \times (((((((((((((((89 \cdot 2 + 0)2 + 0)2 + 89)2 + 89)2 + 89) + 0)2 +$$
$$89)2 + 0)2 + 89)2 + 0)2 +$$
$$0)2 + 89)2 + 0)2 + 0)2 + 89).$$

In table representation, one gets the following intermediate values:

| N | coef. mn of xm | last sum + mn × z | new sum × 2 |
|---|---|---|---|
| 0 | 1 | 89 | 178 |
| 1 | 0 | 178 | 356 |
| 2 | 0 | 356 | 712 |
| 3 | 1 | 801 | 1602 |
| 4 | 1 | 1691 | 3382 |
| 5 | 1 | 3471 | 6942 |
| 6 | 0 | 6942 | 13884 |
| 7 | 1 | 13973 | 27946 |
| 8 | 0 | 27946 | 55892 |
| 9 | 1 | 55981 | 111962 |
| 10 | 0 | 111962 | 223924 |
| 11 | 0 | 223924 | 447848 |
| 12 | 1 | 447937 | 895874 |
| 13 | 0 | 895874 | 1791748 |
| 14 | 0 | 1791748 | 3583496 |
| 15 | 1 | 3583585 | |

The last element is optionally no longer multiplied.

The result of the sum is 3583585 decimal=0000 0000 0011 0110 1010 1110 0110 0001$_2$. To improve the readability, the digits (bits) in the binary code (base 2) have been written in groups of 4 bits each. A group of 4 bits then corresponds to a digit in hexadecimal code (base 16). After division by $2^{15}$, or the right shifting by 15 bits, one gets 0000 0000 0110 1101 [0101 1100 1100 0010]$_2$ or 006d[5cc2]$_{16}$ or 109 decimal. The digits between [and] in the binary and hexadecimal code are the decimal places eliminated by the right shifting. For the decimal bits in the binary code, a final bit with 0 has been appended, which can be done without altering the value. In practice, this bit is also present in a shift register where the rightward expelled bits are captured in another register.

Optionally, the last element can also be multiplied by 2 once more, and then the division will be by $2^{16}$ instead of by $2^{15}$, corresponding to a right shifting by 16 bits without changing the result.

This procedure is advantageous in many microcomputers, for then only the upper 16 bits have to be accepted and the lower 16 bits can simply be discarded. This can occur, e.g., by only reading out the upper 16 bits of the result storage.

For this case, the sum is 71677170 decimal=0000 0000 0110 1101 0101 1100 1100 0010$_2$. After division by $2^{16}$ or a right shifting by 16 bits, one gets 0000 0000 0110 1101.0101 1100 1100 0010$_2$ or 006d5 cc2$_{16}$ or 109 decimal.

The first bit after the decimal has the significance $2^{-1}=\frac{1}{2}=0.5$ and decides whether rounding off is needed. All subsequent bits produce at most 0.4999 . . . in the sum, i.e., they do not lead to rounding off. This is because the limit value of the sum in $2^{-n}$ for n→∞ is equal to 2 and the terms $2^0$ and $2^{-1}$ together already yield 1.5, so that the remainder is smaller than 0.5, since n is at most p and thus finite.

Since in the example shown the first bit after the decimal is 0 after the right shifting, no rounding is done. Therefore, the result g of the multiplication is g=z×x=89×1.2288≈109.

Figure 2A:
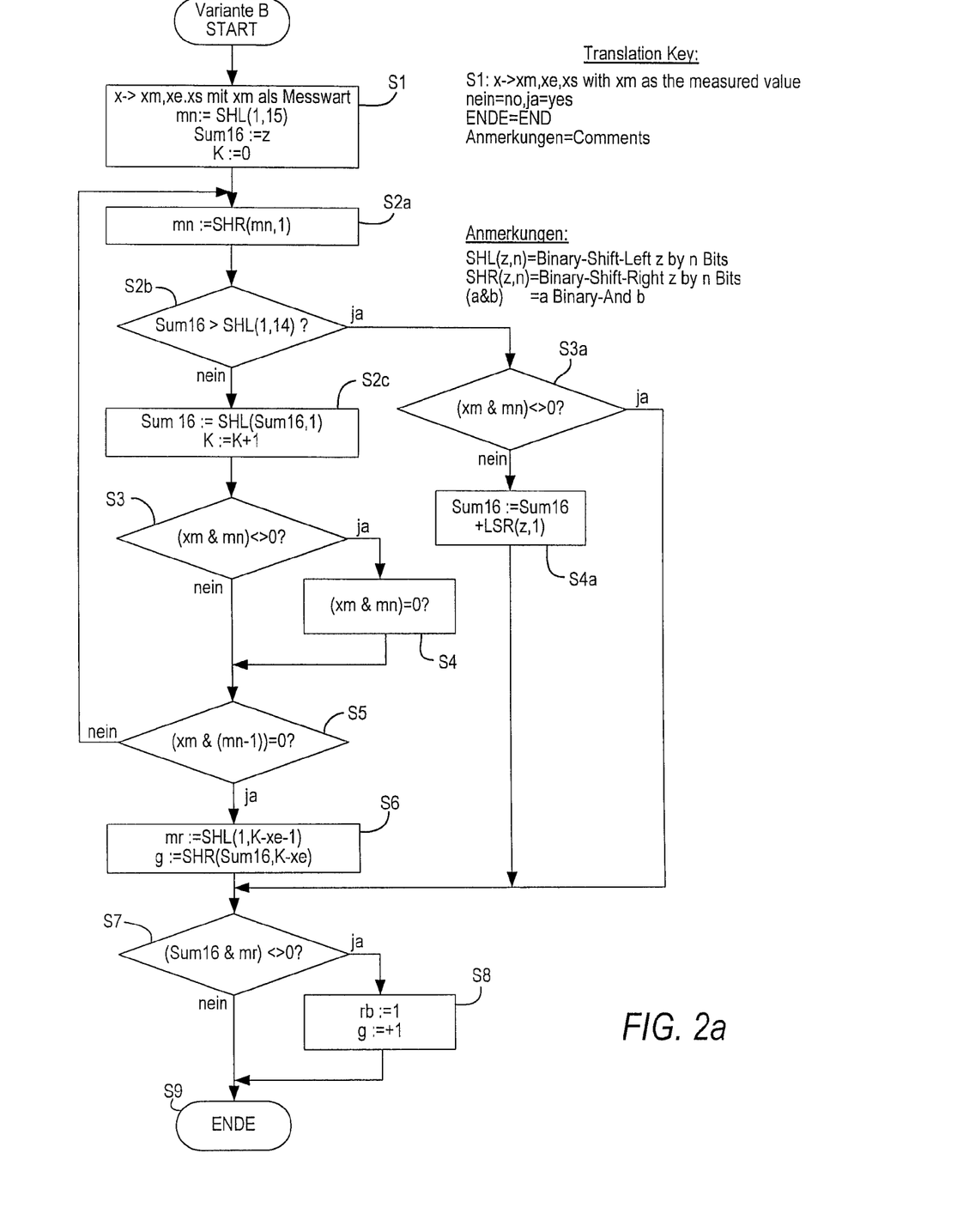
FIG. 2a provides an alternative algorithm according to a modified embodiment.

FIG. 2a shows, as a further sample implementation of the method in the form of a flow chart, an algorithm that works with a 16-bit sum and only calculates as long as the 16-bit value region allows. For simplicity, the permitted value region for the first whole number z is restricted to +32767. However, when needed, the next term of the sum is added to this with a factor of ½, which corresponds to a ⅘ rounding, and accordingly dividing is done by a 2" with smaller n, which corresponds to a smaller shift.

The accuracy of this second algorithm is generally sufficient for technical applications. It is even faster and needs only a word width less than 32 bits in microcomputers and thus also less program memory and data memory.

The second algorithm differs from the sequence in the first algorithm per FIG. 1 merely by process steps in the region of the loop, and also in that a reduction of the storage region for the individual values to 16 bits has been done. The sum storage and the sum Sum 32 is therefore replaced by a sum storage for the smaller maximum sum Sum16 with 16 bits word width. Therefore, what is described hereafter are only steps of the method which differ from those of the flow chart per FIG. 1.

The second step of the method is subdivided into three sub-steps. In a first sub-step of the second step S2a of the method, the mantissa mask mn or its representation in a storage region is shifted to the right by 1 bit with a logic shift.

After this, in a second sub-step of the second step S2b of the method, a check is made to determine whether the sum Sum16 is already larger than a quarter of the permitted value region of the sum Sum16, because in such a case an overflow could occur from another left shift, corresponding to ×2, followed by addition. If not, the further steps S2c, S3, S4 and S5 occur, which correspond to the remaining sub-steps of the second step S2 of the method and the third to fifth steps S3-S5 of the algorithm per FIG. 1. If, in the second sub-step of the second step S2b of the method, it is determined that the sum is larger, an additional polling S3a is performed, checking to see whether the bit of the mantissa xm being examined is equal to zero. If so, one goes directly to the sixth step S6 of the method. If not, the sum Sum16 is again formed by the former value of the sum Sum16 plus the value which results from a logical right shifting of the first whole number z by 1 bit, which occurs in a step S4a, comparable to the original fourth step. This corresponds to an adding of half of the first whole number z to Sum16. After this, one goes to the sixth step S6 of the method.

Figure 2B:
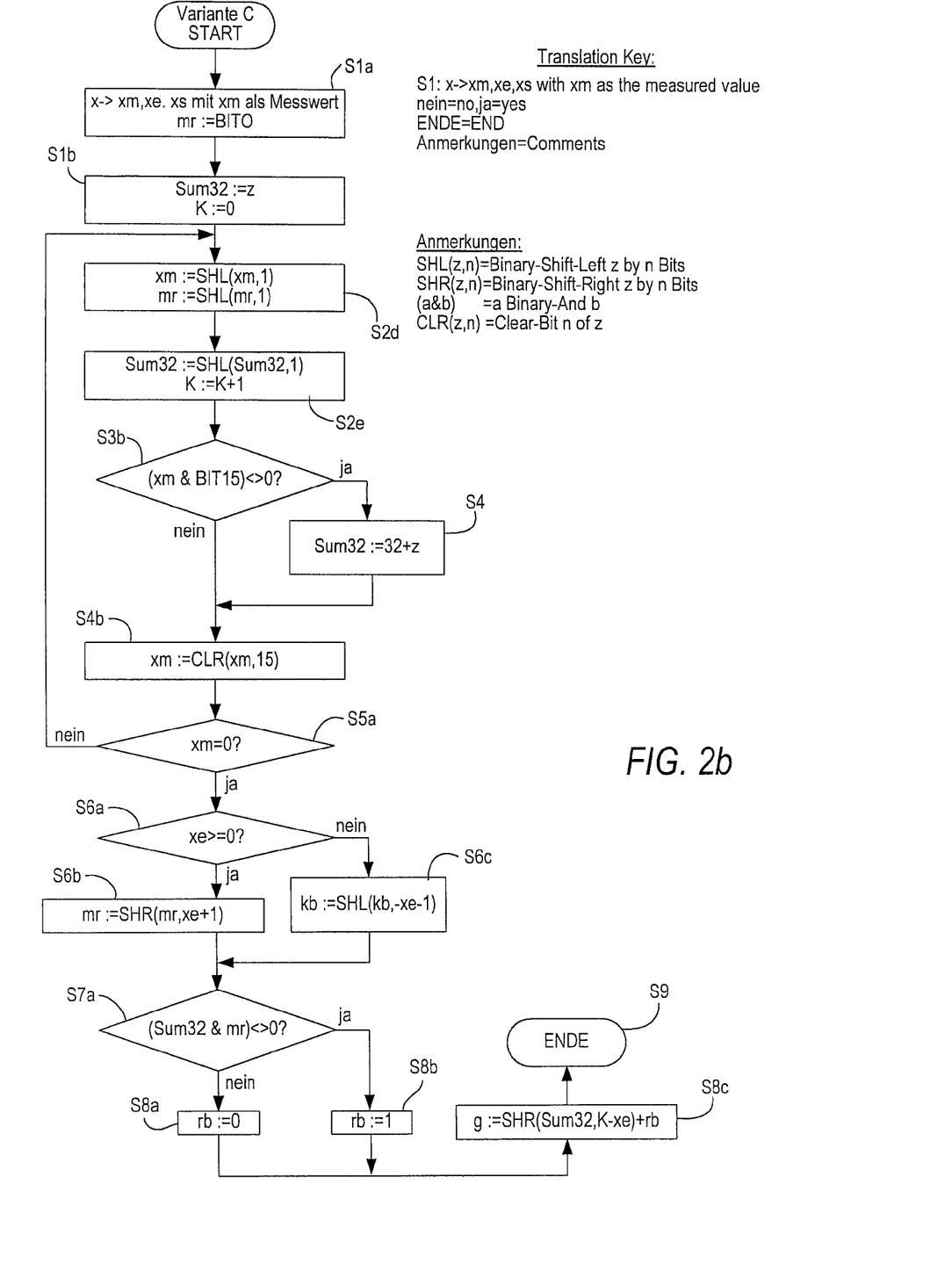
FIG. 2b, provides another alternative algorithm according to a modified embodiment.

The flow charts represented in FIGS. 1, 2a and 2b constitute a special subvariant of the general method, since in these subvariants the arithmetic process ends prematurely at i=number of loop iterations K, once all further coefficients of the mantissa mi . . . mp are equal to 0. This premature ending of the sequence or program loop makes sense, for only the value 0 would now be added to the sum.

If, in the fifth step S5, the polling "xm & (mn−1))<>0?" is replaced by a testing of a counting variable for an end value, such as "K<16?" for a mantissa with 16 bits, the arithmetic loop will be run through by a left shifting and possibly addition with a constant number of loop iterations. But the prematurely ended method is just as precise and thus will generally be executed faster.

As an option, it is advantageous to use the mantissa M of x as a precalculated constant. If the floating-point number x, as the factor, is constant, one can precalculate the mantissa M as xm and the exponent E as xe as well as the sign S as xs on another microcomputer, e.g., a PC, and store them as constants in the program memory of the microcomputer on which the multiplication by a variable whole number z, as the measured value, is going to occur.

Especially advantageous is a technical implementation of the sequence of the method on a microcomputer with a whole number multiplication command. If the microcomputer has a command for the multiplication of two whole numbers $g=z1 \times z2$, one can use this for the multiplication of a whole number by a floating-point number $g=z \times x$ by interpreting the mantissa M of the floating-point number x in the IEEE-754 floating-point format as a whole number xm and multiplying it by the whole number z. After the multiplication, all that remains to be done it to discard bits corresponding to the exponent e and the precision p of the mantissa of x, namely p-e bits.

FIG. 2b shows, as another sample implementation of the method in the form of a flow chart, an algorithm which left-shifts the bits in the storage region for the mantissa xm by one bit, which is indicated by the operation SHL, so that the relevant bit for the test is always found at the place of the MSB (most significant bit), corresponding to step S2d. Instead of the mantissa xm, a copy of the mantissa xm can be deposited in another storage region when the mantissa xm itself is not supposed to be altered. Therefore, one only needs to look at the MSB when deciding whether z should be added once again to the sum Sum32, corresponding to step S3b. After checking the MSB, it is erased with a delete operation CLR, so that the MSB is no longer contained in the mantissa xm, corresponding to step S4b. The loop ends in step S5a, once the mantissa xm is ZERO, i.e., tested bits have been erased and no more untested bits are contained, because all following bits of the mantissa xm are ZERO.

For the determining of the rounding bit rb, a bit mask mr is created already in an introductory step S1a and it is updated in a first loop step Std, and it only needs to be corrected after the loop with the exponent xe by shifting per the operations SHR and SHL, which is done in steps S6a-S6c. With this bit mask mr, the value of the rounding bit rb can be determined, which is done in steps S7a, S8a, S8b. Finally, the result g is taken as the sum Sum32, right-shifted by K-e per the operation SHR and incremented by the value of the rounding bit rb.

Figure 3:
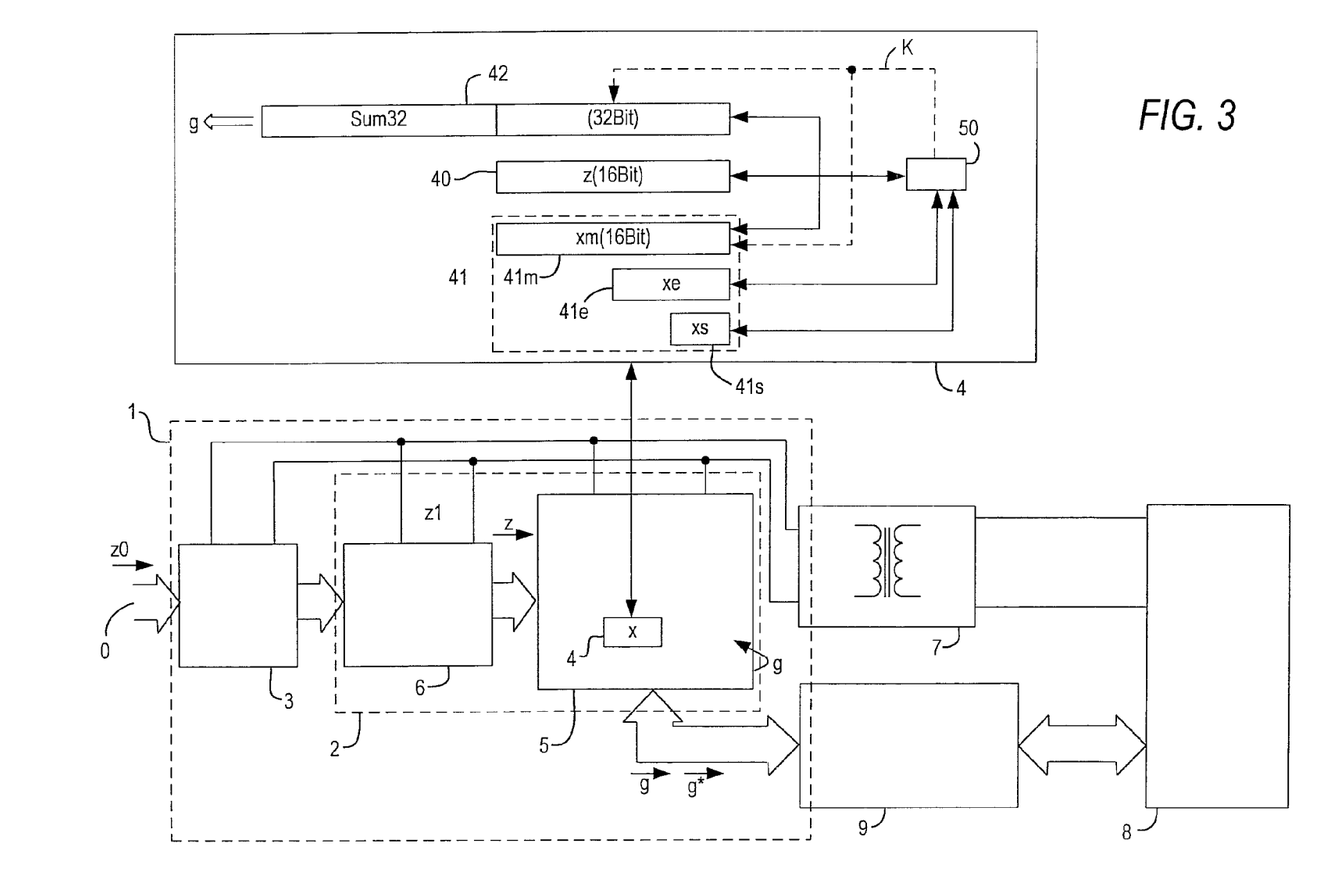
FIG. 3 is a pictorial array of sample components of a measuring device for the processing of a measured value.

FIG. 3 shows components of a sample liquid level metering device 1, which are designed and/or actuated to process measured values z-0. The measured values z0 are presented at a measured value input 0. For example, the measured value input is a sensor, which detects liquid level data. A sensor electronics 3 prepares the measured values and feeds them to a computer 2. The computer 2, shown as an example, is preferably a microcomputer, which is designed to process data with the least possible hardware and software expense, so that an economical and at the same time energy-saving computer 2 can be used. The data provided by the sensor electronics 3 are converted into digital data by means of an analog-digital converter 6, which can be designed as a component of the computer 2, and presented to a processor 5 as the first whole numbers z. Preferably, the processor 5 is a microprocessor with only a small program memory and low power consumption, not being outfitted with a multiplication command for floating-point numbers. The processor 5 preferably has a memory 4 which is outfitted with the least possible number of storage locations.

Data processed by the processor 5 are put out as digital data in the form of the result g or results g* dependent on g to external devices and components. For this, the digital data or the particular result g or results g* dependent on g are presented to an interface 9, which can be outfitted with optocouplers, for example, as an interface for a data communication. However, other kinds of interface can also be used. The interface 9 puts out the data as digital data to an external processing device 8, which can be outfitted, for example, as another microprocessor, a field device, an evaluation device, a guidance system, a microcomputer, or a personal computer.

For the current or voltage supply, there is a voltage source 7, for example, which is designed as a voltage transformer. From an external device, such as the external processing device 8, an intrinsically safe power supply can thus be created at the voltage source in the form of the voltage transformer, in order to provide current or voltage to internal components of the liquid level metering device, such as the sensor electronics 3, the analog-digital converter 6 and the processor 5.

The arrangement depicted, especially its processor 5 with the memory 4, are designed to multiply the first whole number z by an adjustment factor in the form of the floating-point number x with the least possible expense and power consumption. For this, the processor 5 has a logic 50 with simple addition commands, as well as the ability to perform shift operations in registers or logical shift operations in a storage region of the processor.

The memory 4 contains, in particular, a first storage region 40 for saving the first whole number, while the first storage region 40 has a storage location for the saving of 16 bits. Furthermore, the memory 4 has a second storage region 41m, which is designed to save the second whole number xm and provides a storage space for 16 bits. Moreover, there is available a storage region 41e for saving 8 bits of the exponent and 41s for saving 1 bit as the sign. To perform computational operations, there is a computation storage region 42, which provides a value range of 32 bits. Here, the sum Sum32 is saved. In particular, the computation memory 42 is advantageously designed as a shift register, so that multiplications and divisions of the saved number by the value of the base of the exponential number can be done by simple right and left shift operations by 1 bit. But instead of a shift register, an arithmetic unit of the processor 5 with shift register can also be implemented.

To provide the first whole number z and the second whole number xm, the logic 50 is designed to save these as binary encoded numbers in the first and second storage region 40, 41m, as well as 41e and 41s. Optionally, however, the second whole number in particular can also be supplied externally via the interface 9, so that an external computer can be made to perform the conversion or transformation of the floating-point number x into the exponential representation as a whole number xm, as well as the corresponding exponent xe and sign xs.

Figure 4:
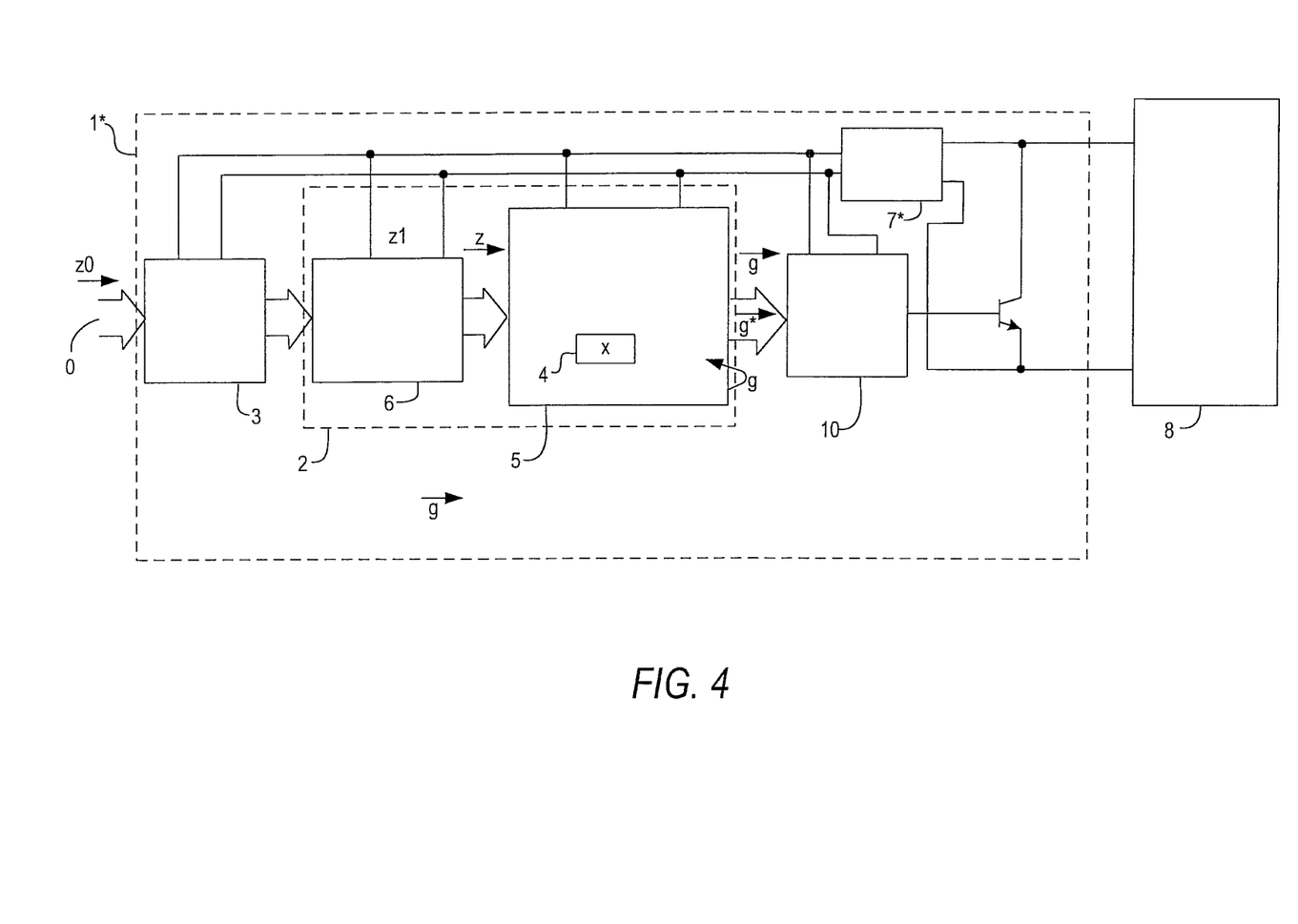
FIG. 4 is an alternative embodiment of components for such a measuring device as noted in FIG. 3.

FIG. 4 shows a configuration of components of an alternative liquid level metering device 1*, for which only differences from the configuration of FIG. 3 shall be described hereafter. In this configuration, the numbers or result g or results g* dependent on g that are put out by the processor 5 are presented to a digital-analog converter 10, which is optionally integrated in the processor 5 or the computer 2. From the digital-analog converter, analog values are put out accordingly and presented to a transistor. This is hooked up, for example, between two voltage leads of the voltage source 7, so as to form a current sink depending on the control of the transistor and thereby present analog data to the external processing device 8. The voltage source 7*, in turn, energizes components of the liquid level metering device 1*, and also the digital-analog converter 10 in the present instance, with an operating voltage.

Figure 5:
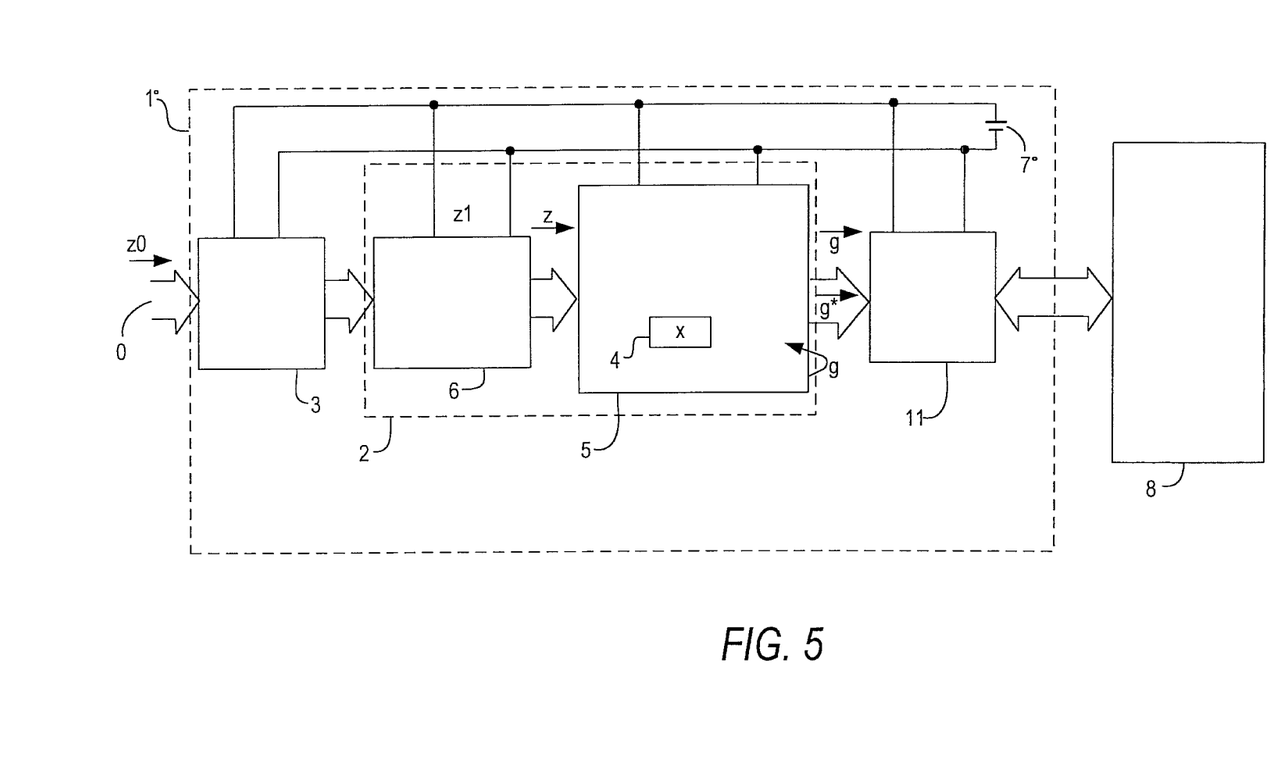
FIG. 5 depicts another alternative embodiment with further modifications of the components for the processing of a measured value.

FIG. 5 shows components of yet another modified liquid level metering device 1°, and again only differences from the configuration of FIG. 3 shall be described. In this configuration, the voltage source 7° is a battery, which energizes a liquid level metering device 1° installed externally from other supply equipment. Instead of a hard-wired or optical interface, there is a transmission module 11, to which the digital data and the result g or results g* dependent on g are presented in order to communicate the result and possibly other digital data to an external processing device 8 via a network, optical links, or radio links.

In the claims, means or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. An apparatus for applying a measured value, said apparatus comprising:
    (a) a measured value input to apply said measured value;
    (b) at least a first memory region to provide for an adjustment factor; and
    (c) a data processing system, wherein said data processing system is designed and/or controlled to multiply a first whole number by a floating-point number to obtain a product of said multiplication, while the first whole number corresponds one of said applied measured value, another measured value, or to said provided adjustment factor, and said floating-point number corresponds to the other measured value or to said adjustment factor, characterized in that:
        (i) said data processing system has a second memory region for storing of said floating-point number in a format of a second whole number, especially with corresponding exponent and sign, and
        (ii) said data processing system is designed and/or controlled to carry out a multiplication of said first whole number and said second whole number.

2. The apparatus of claim 1, said apparatus being of a kind selected from the group comprising:
    (a) a sensor;
    (b) an operator device;
    (c) a communication device; and
    (d) a liquid level metering device.

3. The apparatus according to claim 1, wherein said data processing system further comprises a logic, said logic designed and/or controlled to:
    (a) convert said floating-point number into an exponential number having one place for the sign and a plurality of places for an exponent and a plurality of places for a mantissa as the second whole number; and
    (b) discard a number of places of the multiplication product after the multiplication, depending on a precision of the mantissa and of the exponent.

4. The apparatus according to claim 3, wherein said exponential number is a binary number.

5. The apparatus according to claim 3, said apparatus further comprising said first memory region and said logic of said data processing system and wherein said second memory region is actuated thereby are designed to save said second whole number as a binary number with one place for a sign and with a plurality of places for an exponent and a plurality of places for a mantissa.

6. The apparatus according to claim 1, said apparatus further comprising a computation memory, said computation memory for providing computation storage.

7. The apparatus according to claim 6, wherein:
    (a) said computation memory further comprises a region, and wherein said region is designed or can be actuated as a register; and
    (b) said data processing system has a logic, said logic designed and/or controlled to perform said multiplication by a power of two, and/or a division by a power of two, through a bitwise shifting of a content of said computation memory region.

8. A method for actuating a data processing system, said actuation further comprising the steps of:
    providing an apparatus for applying a measured value, said apparatus further performing the steps of:
    (a) enabling said data processing system to multiply a first whole number by a floating-point number to obtain a product of said multiplication, and wherein:
        in a first instance said first whole number corresponds to either said applied measured value or to a second measured value, or
        in a second instance to a provided adjustment factor and the floating-point number corresponds to said second measured value or to said adjustment factor;
    (b) providing said floating-point number in a format or a representation of a second whole number; and
    (c) performing a multiplication of said first whole number and said second whole number.

9. The method of claim 8, wherein said floating point number is said second whole number, and further comprising the step of converting said floating point number into an exponential, with one place for a sign, a plurality of places for an exponent, and a plurality of places for a mantissa.

10. The method according to claim 8, wherein said exponential is a binary number.

11. The method according to claim 9, said method further comprising the step of discarding, after said multiplication step, a set of one or more places starting from the position of the LSB of said multiplication product depending on a precision of said mantissa and of said exponent.

12. The method according to claim 9, said method further comprising the step of repeatedly adding and bitwise shifting of a content of a computation memory region of said data processing system.

13. The method according to claim 9, said method further comprising the step of repeatedly reading out the content of a computation memory region of said data processing system.

14. The method according to claim 8, wherein said multiplication step further comprises the step of carrying out a whole number multiplication command of said data processing system, wherein a mantissa of said floating-point number is interpreted as a whole number and multiplied by the first whole number, whereupon bits starting from the position of the LSB are discarded after said multiplication, corresponding to an exponent and a precision of the mantissa.

15. The method according to claim 14, wherein said floating-point number is in the IEEE-754 floating-point format.

16. The method according to claim 9, further comprising the step of terminating prematurely a loop of additions and shift operations after a number of K iterations of the loop, once all further coefficients of the mantissa are equal to 0, whereupon K-e bits are discarded after the multiplication, corresponding to an exponent e and a precision p of the mantissa, and the number K of loop iterations is at most as large as the precision p.

17. The method according to claim 8, further comprising the step of carrying out a bitwise shifting of a content of a computation memory region of said data processing system to perform a division by a power of two.

18. The method according to claim 8, further comprising the step of reading out the content of the computation memory region to perform a division by a power of two.

19. The method according to claim 8, further comprising the step of calculating externally and providing in a second memory region of said data processing system said second whole number and said corresponding exponent as well as said corresponding sign.

20. The method according to claim 8, further comprising the step of multiplying the value of a sum by the value of the base of the exponent repeatedly in a loop; and, if a corresponding bit of the mantissa, especially a bit corresponding to a loop iteration, of said second whole number is not equal to zero, the value of said first whole number is added to said sum, and the significance of the bit of said second whole number, which is checked in said each loop, becomes smaller from one loop to another.

21. The method according to claim 8, further comprising the step of establishing that the product of the multiplication is taken to be the value of the sum from which one or more bits were previously discarded starting from the position of the LSB by a division by a power of two and to which the value of a rounding bit was finally added, corresponding to the most significant one of the bits previously discarded by the division by the power of two.

22. A method for applying a measured value in a liquid level metering device comprising a data processing system, said method further comprising the steps of:
 (a) inputting said measured value to said data processing system;
 (b) providing for an adjustment factor by utilizing at least a first memory region;
 (c) utilizing said data processing system, wherein said data processing system is designed and/or controlled to multiply a first whole number by a floating-point number to obtain a product of said multiplication, while the first whole number corresponds one of said applied measured value, another measured value, or to said provided adjustment factor, and said floating-point number corresponds to the other measured value or to said adjustment factor;
 (d) storing in a second memory region of said data processing system said floating-point number in a format of a second whole number, especially with corresponding exponent and sign; and
 (e) carrying out a multiplication of said first whole number and said second whole number within said data processing system.

* * * * *